US010445550B2

(12) United States Patent
Reinhold et al.

(10) Patent No.: US 10,445,550 B2
(45) Date of Patent: Oct. 15, 2019

(54) ARRANGEMENT FOR THE OPTICAL RECORDING OF LIVE SKIN AREAS OF HUMAN AUTOPODIA AND OF DOCUMENTS

(71) Applicant: JENETRIC GmbH, Jena (DE)

(72) Inventors: Joerg Reinhold, Jena (DE); Christoph Diener, Jena (DE); Roberto Wolfer, Jena (DE)

(73) Assignee: JENETRIC GmbH, Jena (DE)

( * ) Notice: Subject to any disclaimer, the term of this patent is extended or adjusted under 35 U.S.C. 154(b) by 0 days.

(21) Appl. No.: 16/128,020

(22) Filed: Sep. 11, 2018

(65) Prior Publication Data

US 2019/0080139 A1    Mar. 14, 2019

(30) Foreign Application Priority Data

Sep. 12, 2017  (DE) .................. 10 2017 008 710

(51) Int. Cl.
  *G06K 9/20*      (2006.01)
  *G06K 9/00*      (2006.01)
  (Continued)

(52) U.S. Cl.
  CPC .......... *G06K 9/0004* (2013.01); *G06F 3/042* (2013.01); *G06F 3/0421* (2013.01);
  (Continued)

(58) Field of Classification Search
  CPC ....................................... G06K 9/00006–0012
  See application file for complete search history.

(56) References Cited

U.S. PATENT DOCUMENTS 6,886,104 B1    4/2005  McClurg et al.
7,190,817 B1    3/2007  Schneider et al.
(Continued)

FOREIGN PATENT DOCUMENTS

DE       102015116026 A1    3/2017

OTHER PUBLICATIONS

Dermalog, "All-in-One Scanner VF1", product brochure, v_1.2_170720, copyright 2017, 5 pages total. (Year: 2017).*
(Continued)

*Primary Examiner* — Brian Werner
(74) *Attorney, Agent, or Firm* — Patentbar International, P.C.

(57) ABSTRACT

An arrangement and method for optical recording of live skin areas of human autopodia and documents has a layer body comprising sensor layer with light-sensitive elements in regular pixel rasters, transparent protective layer above the sensor layer as placement surface for skin areas or documents is integrated in a mobile image capture device having at least one display for user guidance and an internal power supply. The layer body has an area light-emitting layer under the sensor layer to emit light in a first angle range for frustrated total internal reflection at the placement surface when autopodia are placed thereon and to emit in a second angle range to illuminate documents on the placement surface. A controlling and data processing unit handles preprocessing and reducing captured image data and an electronic interface for wireless coupling of the image capture device with a further electronic device for image data processing.

22 Claims, 14 Drawing Sheets

(51) Int. Cl.
*G06F 3/042* (2006.01)
*G06K 9/03* (2006.01)
*H03K 17/96* (2006.01)

(52) U.S. Cl.
CPC ..... *G06K 9/00046* (2013.01); *G06K 9/00456* (2013.01); *G06K 9/00912* (2013.01); *G06K 9/00979* (2013.01); *G06K 9/036* (2013.01); *H03K 17/9627* (2013.01)

(56) References Cited

U.S. PATENT DOCUMENTS

| | | | |
|---|---|---|---|
| 7,245,765 | B2 | 7/2007 | Myers et al. |
| 7,817,821 | B2 | 10/2010 | Milne et al. |
| 8,036,431 | B1 | 10/2011 | Fisher et al. |
| 2009/0226052 | A1* | 9/2009 | Fedele ............... G06K 9/00046 382/125 |
| 2012/0321149 | A1 | 12/2012 | Carver et al. |
| 2016/0110025 | A1 | 4/2016 | Hossu |
| 2016/0294557 | A1 | 10/2016 | Baldwin et al. |
| 2017/0032166 | A1* | 2/2017 | Raguin ................. G06F 3/033 |

OTHER PUBLICATIONS

PR Newswire, "DERMALOG Presents the World's First Combined Fingerprint and Passport Scanner", Nov. 17, 2015 08:18 AM EST, 8 pages. (Year: 2015).*

Crossmatch, "Guardian R2; Ruggedized, Appendix F Certified Ten-print Livescan", product brochure, 2016, 2 pages total. (Year: 2016).*

Ilya Grigorik, Image Optimization, http://web.archive.org/web/20170731194015/https://developers.google.com/web/resources/contributors#ilyagrigorik.

* cited by examiner

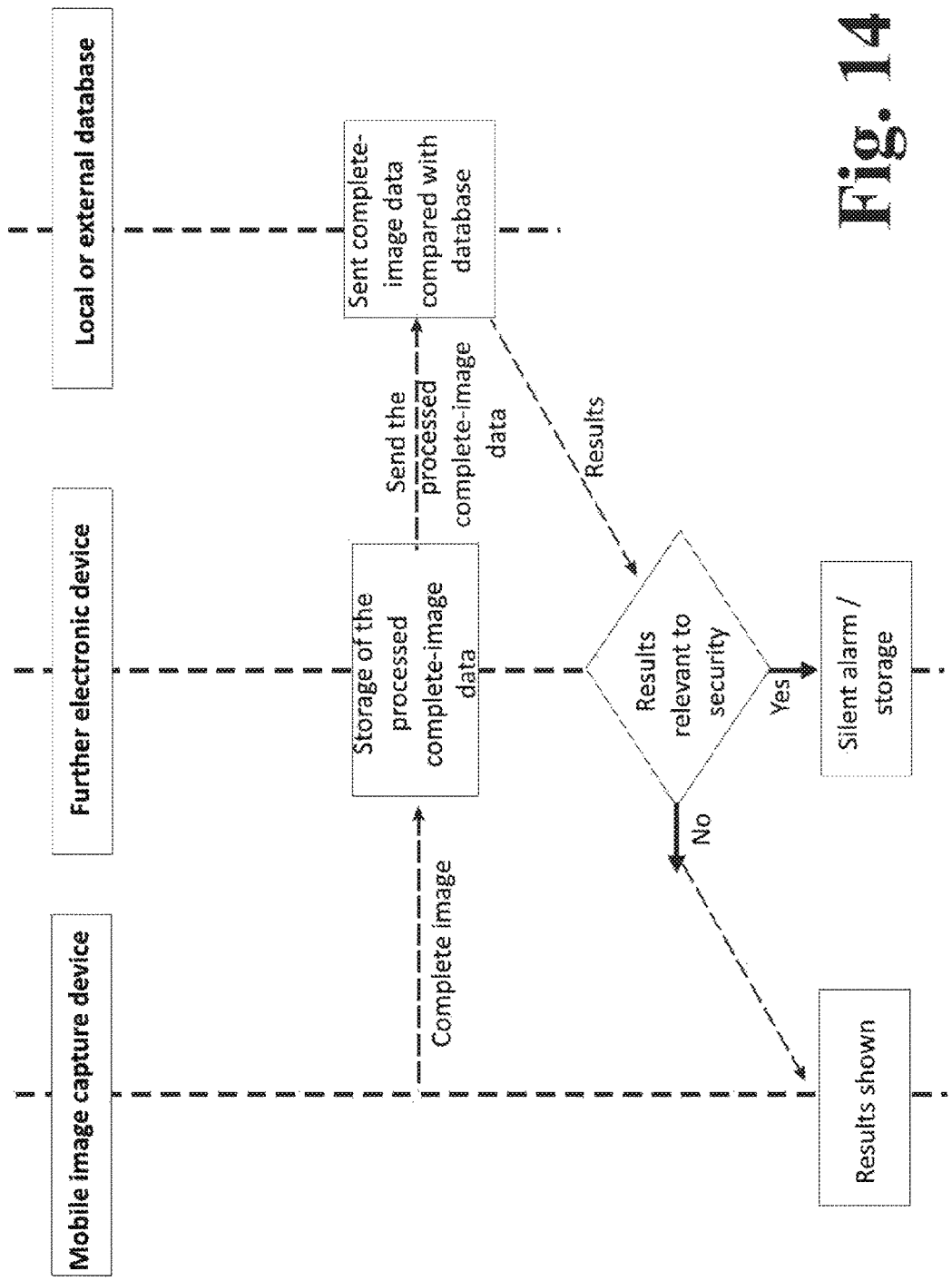

ARRANGEMENT FOR THE OPTICAL RECORDING OF LIVE SKIN AREAS OF HUMAN AUTOPODIA AND OF DOCUMENTS

RELATED APPLICATIONS

This application claims priority to German Patent Application No. DE 10 2017008 710.5, filed Sep. 12, 2017 which is incorporated herein by reference in its entirety.

FIELD OF THE INVENTION

The invention is directed to an arrangement and a method for the optical recording of live skin areas of human autopodia and of documents. It is applied in particular for personal identification in international border traffic and in the domain of flight security but also, for example, for retail credit card payment.

BACKGROUND OF THE INVENTION

The detection and identification of persons is steadily gaining importance. At international border crossings, for example, checking of identity documents (ID documents) is essential. Increasingly, fingerprints of more than one phalanx are also recorded and compared against databases.

One border control scenario consists in crossing the border in an automobile. In the near future, all of the passengers in the automobile will have fingerprints recorded for all ten fingers. At least, four fingers (without thumbs) of a hand should be recorded simultaneously in order to avoid errors in the recording sequence (and therefore in associating the image with the respective finger). Further, recording a plurality of fingers simultaneously promises to speed up the process compared to consecutive recordings. An image of the driver's license or of another personal document (ID document) will also be recorded.

When using arrangements or equipment known from the prior art, the passengers must exit the vehicle and have their fingerprints taken at a stationary device in the border control building. Arrangements such as those used in other border crossing scenarios, e.g., in international airports, can also be used in this case. Stationary fingerprint reading devices and additional document reading equipment are mostly used. However, there are also already prior art devices which can record documents and fingerprints with one and the same device (DE 10 2015 116 026 A1). This can save time during the recording process. Recording documents and fingerprints consecutively over the same placement surface prevents mistakes due to erroneous association of more than one placement surface. A device which can read fingerprints as well as documents also would appear to be cheaper to produce than two separate devices.

However, the stationary configuration described above for capturing fingerprints and possibly ID documents still has the disadvantage that the passengers must exit the vehicle. On the other hand, there are also prior art concepts for mobile fingerprint reading devices such as those described, e.g., in U.S. Pat. No. 6,886,104 B1 or U.S. Pat. No. 8,036,431 B2 which are suitable to be transported by the control official (e.g., border official) to the person to be recorded. However, these devices are not designed for recording a plurality of fingers simultaneously, and documents can also not be recorded over the same placement surface.

Devices for capturing images of personal identification features in other border crossing scenarios, e.g., border control for trains, also have requirements similar to those for border crossings by automobiles. But it is also preferable in other fields of application to transport a reading device to the person whose identity is to be recorded and/or checked, e.g., retail credit card transactions, registration of displaced persons, or voter registration.

Disclosed mobile solutions can scan either only fingerprints (U.S. Pat. Nos. 8,036,431 B1, 7,190,817 B1, 6,886,104 B1) or only documents (U.S. Pat. No. 7,245,765 B2) or, if both, then only by linking a plurality of devices. A combined recording of fingerprints and documents is known as mobile device solution from U.S. Pat. No. 7,817,821 B2. This discloses a mobile device which includes a document scanner, a fingerprint scanner and a camera for face recording. It is referred to as a "station" in which various individual devices can be integrated and is accordingly a modular device concept.

None of the prior known technical solutions can capture documents and a plurality of fingerprints simultaneously via an individual optical scanner or can be used wirelessly as handheld portable device.

SUMMARY OF THE INVENTION

It is the object of the invention to find a novel possibility for the optical recording of live skin areas of human autopodia and documents for identifying persons which permits a flexible image capture of fingerprints and/or personal documents from any location, particularly for mobile border crossing in international travel, flight security control, identification of displaced persons or other situations in which persons are to be identified.

An arrangement for the optical recording of live skin areas of human autopodia and for the optical recording of documents comprises a layer body with a sensor layer in which light-sensitive elements are arranged in a two-dimensional regular pixel raster, a transparent protective layer above the two-dimensional pixel raster of light-sensitive elements of the sensor layer, which protective layer has an outer surface of the layer body parallel to and at a defined distance from the light-sensitive elements, which outer surface provides a placement surface for the skin areas of multi-segment autopodia or documents to be recorded, at least one two-dimensional or area light source by which light components of the light source can be coupled in from the direction of the sensor layer through the protective layer to the skin areas or the document to be recorded, wherein all of the layers of the layer body which are located between the light source and the placement surface transmit at least portions of light of a required wavelength range, and a control unit for image read-out, image processing and control of the light source. The above-stated object is met in this arrangement according to the invention in that the layer body is integrated in a mobile image capture device having at least one display for displaying a user guidance for the user, an internal power supply which ensures the use of the image capture device for a desired period of use without external power feed, the layer body is supplemented at its underside by the at least one area light source in the form of a light-emitting layer, wherein the at least one area light source is configured to emit light in a first angle range such that light components in the protective layer are internally reflected at the placement surface in order to record skin areas placed on the placement surface using the principle of frustrated total internal reflection and to emit light in a second angle range such that light components illuminate documents placed on the placement surface through the placement surface, and the image capture device has an electronic controlling and data processing unit for preprocessing the captured image data and for reducing the image data for wirelessly sending to a further electronic device, and the mobile image capture device is coupled, via an interface for wireless data transmission and communication, to a further electronic device for image data processing with quality assessment and image data management.

Advantageous embodiments follow from the subclaims.

A mobile image capture device is one which can be used as a fully stand-alone device, particularly cordlessly for image recordings of skin prints and personal documents (particularly ID documents, visas, credit cards, etc.) and is wirelessly connected to a further electronic device for purposes of data transfer. With the image capture device, images of documents and skin areas of human autopodia are recorded on the same recording surface and are sent to the connected further electronic device without basic image data processing. It is only through the connected further electronic device that images are further processed and evaluated and results of the evaluation are sent back to the image capture device so that only high-quality images are transmitted to the connected further electronic device, processed and stored therein or routed to databases or storage systems.

The arrangement according to the invention allows a plurality of fingers to be scanned simultaneously. The active scanning surface allows four fingerprints to be recorded simultaneously. Further, documents, e.g., personal documents (ID documents, driver's licenses or boarding passes), can also be selectively recorded via the same placement surface. Compared with prior art devices, the image capture device for autopodia and documents is substantially lighter and smaller. It preferably has a thickness of less than 5 cm and a weight of less than 500 g. This is made possible through the use of an optical direct scanner with a large-area sensor layer. Therefore, no prisms, imaging optics or illumination optics are needed. The arrangement according to the invention has an accumulator or a battery so as to be independent from the cable power supply at least for a given period of time. Further, it exchanges data wirelessly (e.g., via WLAN, Bluetooth or the like connections) with another device and can accordingly record high-resolution images entirely cordlessly in mobile use, forward these images for evaluation and have results sent in turn. The device is outfitted with a display which is located adjacent to or inside of the placement surface for displaying user information. Preferably, signatures can also be made on this display, electronically registered and likewise transmitted.

Accordingly, the invention also makes it possible to perform the entire sequence of operations for data acquisition in mobile control scenarios and identification scenarios such as border crossing, control of displaced persons, voter registration, boarding in airports, etc. in such a way that the persons who are to be identified need not pass through a stationary control post on foot but, rather, can be identified inside of a vehicle (e.g., automobile or train) or at changing control locations (airport boarding, recording of displaced persons in shelters) with a handheld mobile device. In some cases, this can include a ten-finger recording (4-4-2), document recording, recording of signature and direct checking of personal identity through data comparison with a database.

BRIEF DESCRIPTION OF THE DRAWINGS

The invention will be described more fully in the following through embodiment examples. The drawings show:

FIG. 14 shows a flowchart for the further processing of image recordings of autopodia and documents and communication between mobile image capture device, further electronic device and a database.

DETAILED DESCRIPTION OF THE PREFERRED EMBODIMENTS

Figure 1:
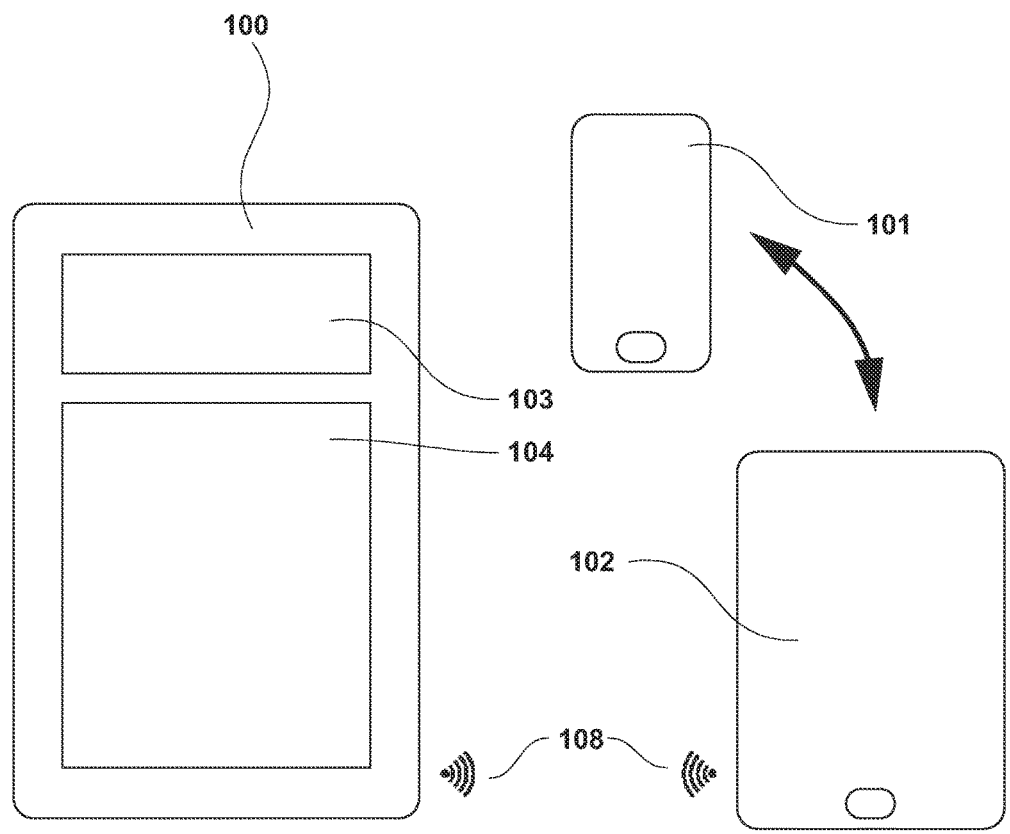
FIG. 1 shows a first implementation and a second implementation of the arrangement according to the invention with an image capture device and a smartphone or a tablet PC.
Figure 2:
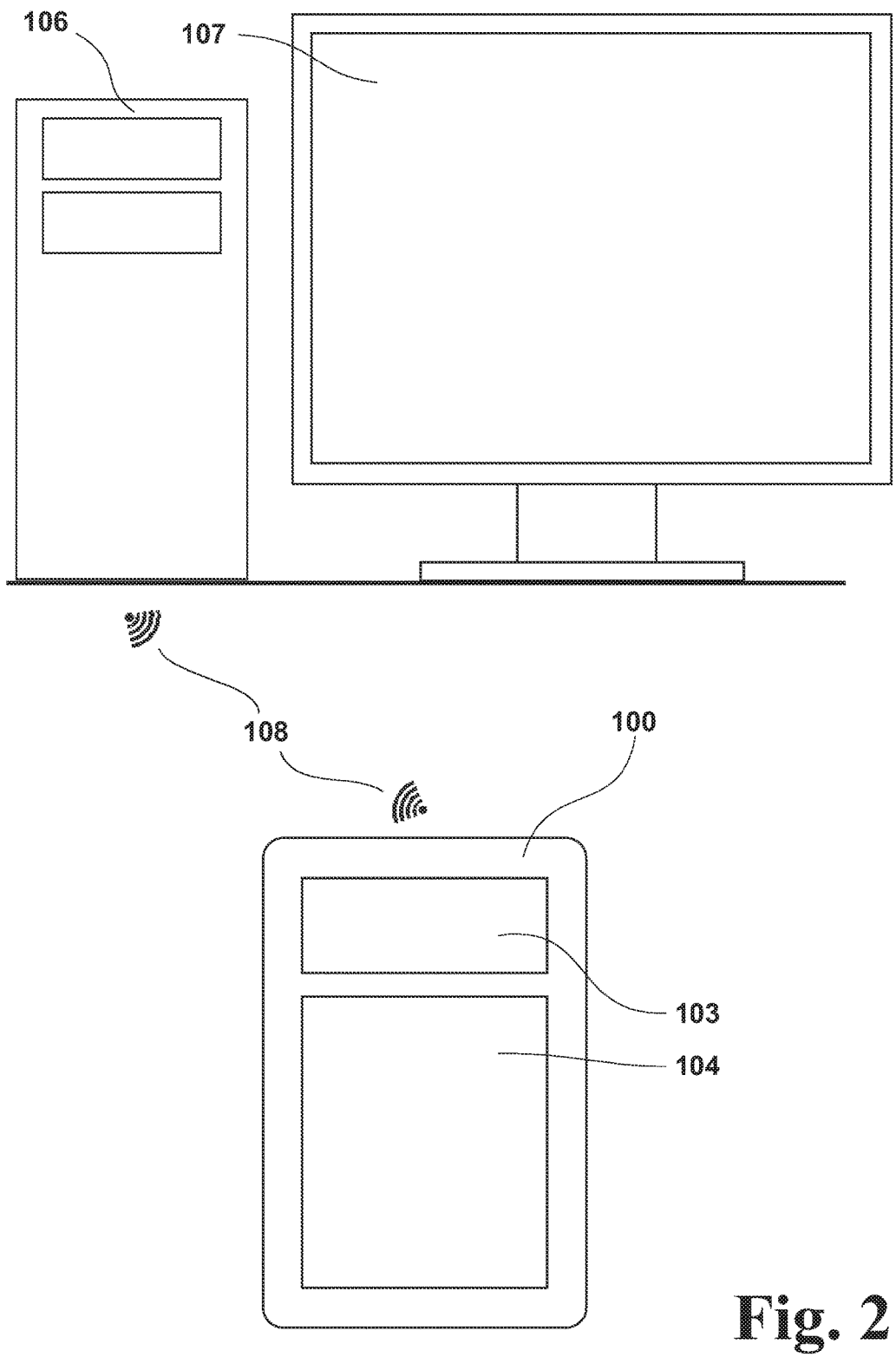
FIG. 2 shows a third preferred implementation of the arrangement according to the invention with an image capture device and a conventional PC with display screen and Internet access.

The arrangement according to the invention comprises a mobile image capture device 100, as is shown in FIG. 1, which is wirelessly connected to a further electronic device. A suitable device to which the image capture device 100 can be connected is, e.g., a mobile phone (smartphone) 101, a tablet PC 102 or also, as is shown in FIG. 2, a desktop computer (PC) 106. A connection between the image capture device 100 and a laptop is also possible.

FIG. 1 shows the mobile image capture device 100 with a placement surface 104 for positioning autopodia 112 or documents 113. A preferred embodiment form is shown with a separate display 103 for a user guidance. The mobile image capture device 100 communicates with one or more further electronic devices via a wireless connection 108. In two preferred embodiment forms, the mobile image capture device 100 is wirelessly coupled either to a smartphone 101 (mobile phone) or to a tablet PC 102.

FIG. 2 shows a third advantageous variant with the image capture device 100 and a coupled further electronic device in the form of an internet-enabled computer (PC) 106 with display screen 107. Coupling is also carried out in this case by means of a wireless connection 108. The connection 108 of a mobile image capture device 100 with a plurality of PCs 106 is also possible. Also, a plurality of image capture devices 100 can be coupled with one PC 106.

Figure 3:
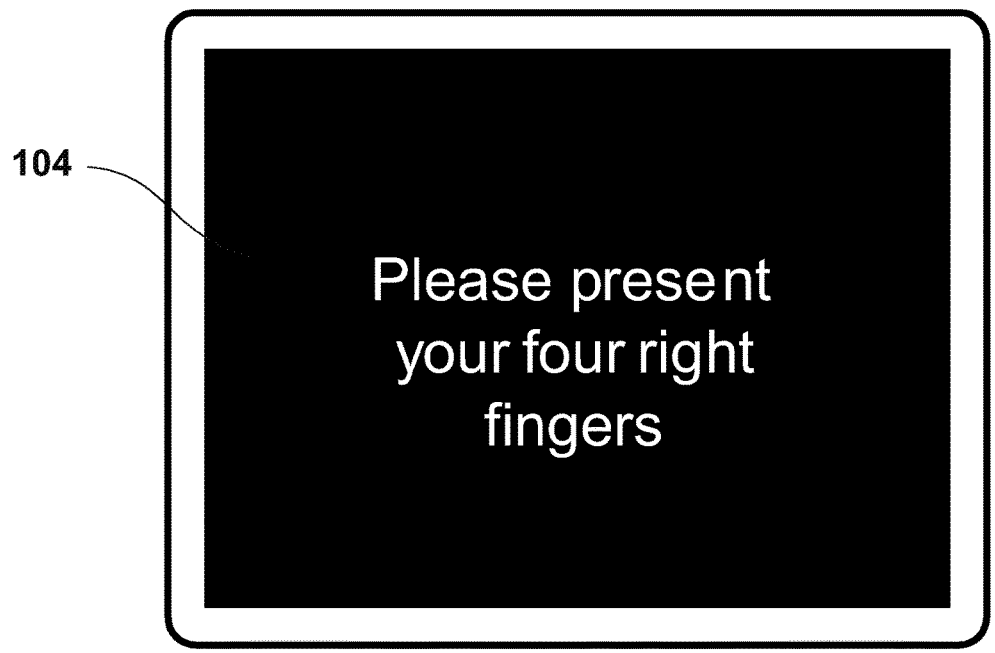
FIG. 3 shows an advantageous construction of the image capture device with a placement surface which is also simultaneously configured as a display for the user guidance.
Figure 3:
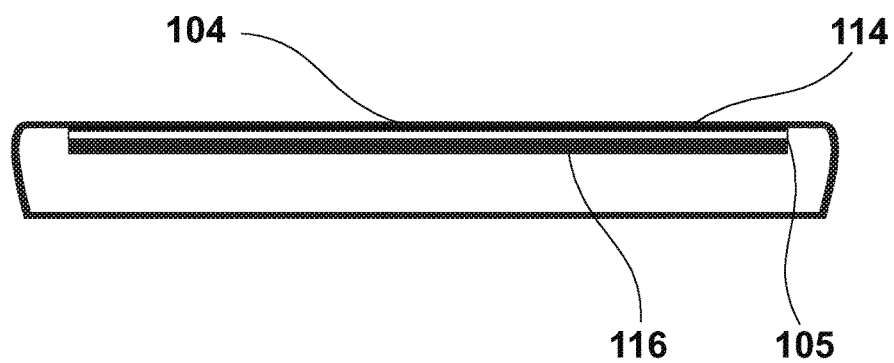

FIG. 3 shows a particularly preferred embodiment example in which the display 103 is located under the placement surface 104, below which is located the layer body 105 with sensor layer 115 and light-emitting layer 116 for direct image capture without optically imaging elements. The user guidance is carried out in this embodiment directly on the placement surface 104 so that it can be interactive and context-based. Another possibility would be a combination with a further display 103 adjacent to the placement surface 104 as is shown in FIG. 1.

Figure 4:
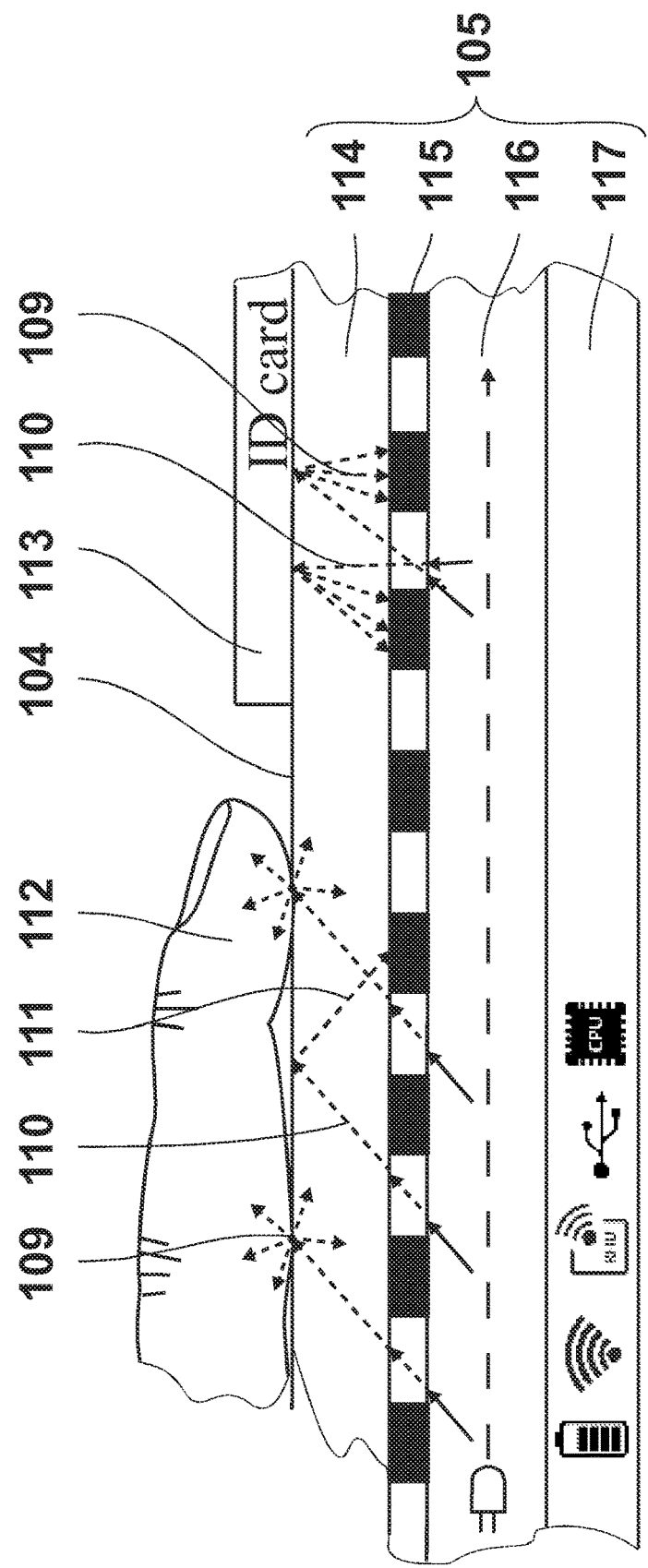
FIG. 4 shows a first construction of the layer body as a sensor unit under the placement surface with a unitary light-emitting layer for illuminating the objects placed thereon.

FIG. 4 shows the layer body 105 inside the mobile image capture device 100. The fingers (autopodia) 112 or the document 113 are placed on the placement surface 104. The placement surface 104 is formed by one side of a protective layer 114. This protective layer 114 protects the sensor layer 115 against damage due to mechanical, chemical or electrical environmental influences. The protective layer 114 and the sensor layer 115 are connected optically and are connected to one another, e.g., optically bonded. On the side remote of the protective layer 114, the sensor layer 115 is likewise optically connected to a light-emitting layer 116. The fingers 112 or the ID document 113 are illuminated by illumination light 110 through the light-emitting layer 116. The light path goes through the sensor layer 115. The components of the illumination light 110 which include at the placement surface 104 an angle with the perpendicular from this surface that is greater than the critical angle of total reflection are totally reflected at the placement surface 104. The internally reflected light 111 can be detected by the sensor layer 115. The ridges 119 of fingerprints or other objects which are in optical contact with the placement surface 104 interrupt this total reflection. In this way, an inverted image of the contacting areas, e.g., of a finger 112 can be recorded. Components of the illumination light 110 which include at the placement surface 104 an angle with the perpendicular from this surface that is smaller than the critical angle of total reflection pass through the placement surface 104 and can illuminate an object, e.g., a document 113, even when it has no optical contact with the placement surface 104.

The scattered light 109 can be detected via the sensor layer 115. The control and supply of power take place in the electronic controlling and data processing unit 117. The latter has an interface for wireless connection 108 to a further electronic device, e.g., mobile phone 101, tablet PC 102 or computer 106. The mobile image capture device 100 is wirelessly coupled to the further electronic device 101, 102 or 106. The image data are further processed in the electronic controlling and data processing unit 117 before sending via the wireless connection 108. For example, image corrections, image evaluations, scaling and compression take place in the electronic controlling and data processing unit 117. The electronic controlling and data processing unit 117 is supplied with power via a chargeable accumulator found inside the mobile image capture device 100. In a preferred embodiment form, this accumulator can be exchanged by the user. The accumulator can be charged, e.g., via a USB interface.

Figure 5:
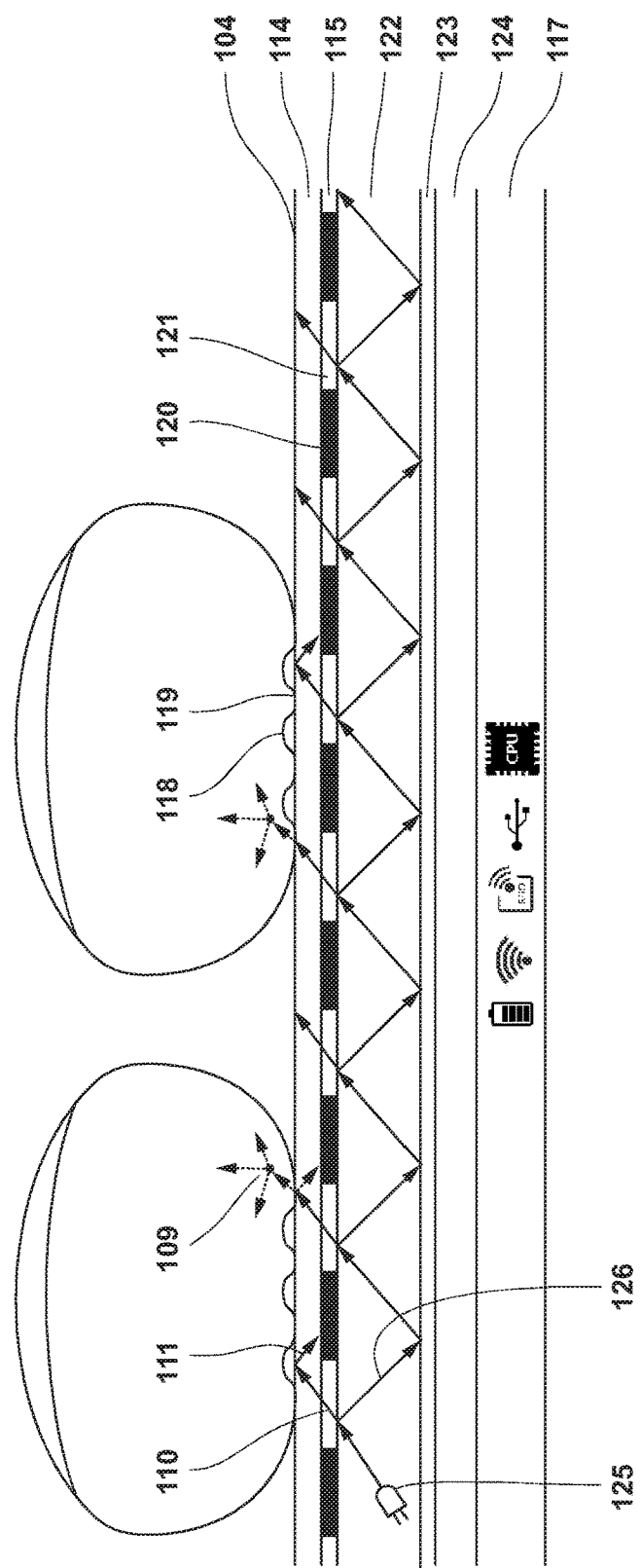
FIG. 5 shows a further construction of the layer body as sensor unit with a light-emitting layer with two different light sources, one light source being configured as waveguide structure for the illumination of autopodia.

A particularly preferred embodiment form is shown in FIG. 5. In this case, there are two light sources inside the light-emitting layer 116: a light source 122 for the illumination of the finger 112 and a light source 124 for the illumination of the ID document 113. In this example, light source 122 for illuminating the finger 112 is constructed as a waveguide. The light propagation 126 of a light-emitting diode 125 in the waveguide ensures that the coupled-in light is distributed in the entire layer of light source 122. The light needed for this can be emitted, e.g., by one or more LEDs 125 and coupled into the waveguide. The waveguide is constructed in this instance such that components of the light are coupled out and pass through the transparent regions 121 of the sensor layer 115 to the placement surface 104.

Figure 6:
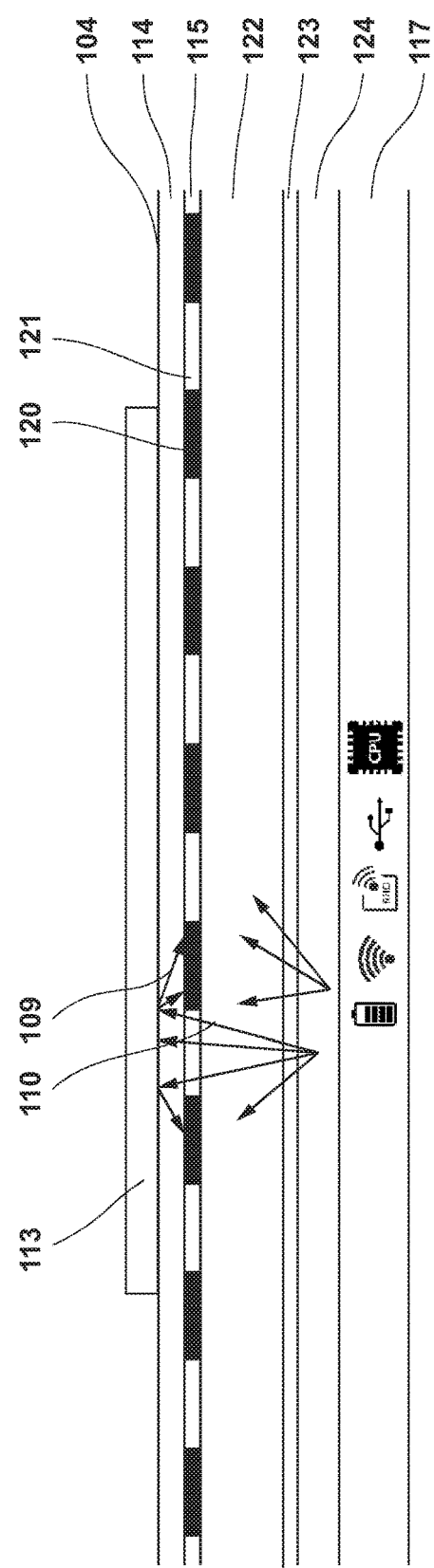
FIG. 6 shows a further construction of the layer body as sensor unit having a light-emitting layer with two different light sources, one light source being configured as a diffusely emitting backlight for the illumination of documents placed thereon.

In a further advisable embodiment form according to FIG. 6, two light sources are again provided within the light-emitting layer 116: a light source 122 for illuminating the finger 112 and a light source 124 for illuminating the document 113. In this constructional variant, the light source 124 for illuminating the document 113 is formed as a diffuse backlight such as is also used, e.g., in LCD displays. The backlight is configured such that components of the coupled-out illumination light 110 exit in different directions and, in doing so, pass through the transparent regions 121 of sensor layer 115 to the placement surface 104 and illuminate a document 113 placed on the latter.

Figure 7:
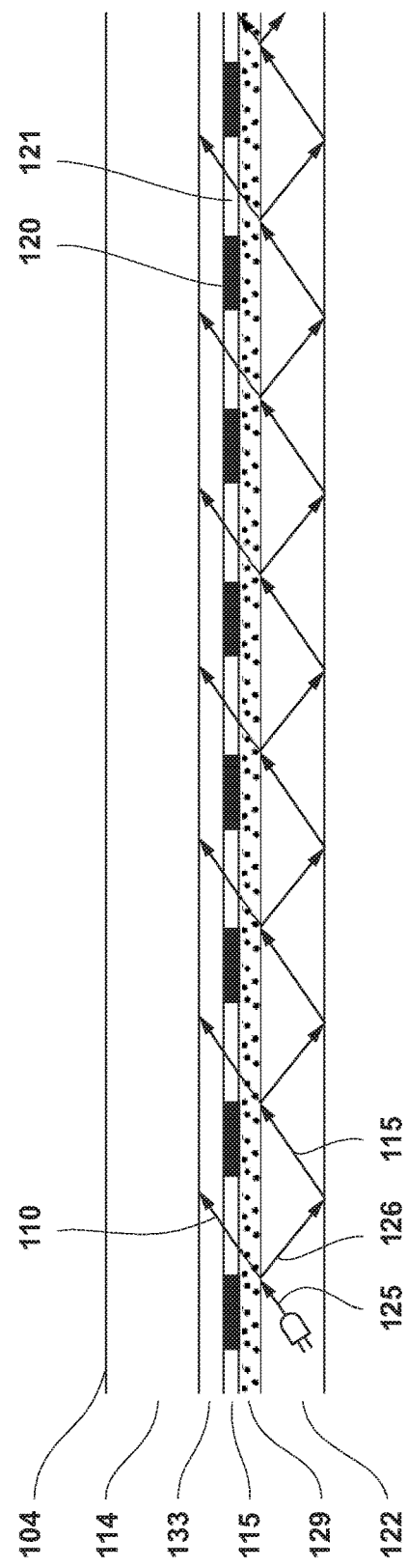
FIG. 7 shows a further construction of the layer body as sensor unit with a light-emitting layer for illuminating objects placed thereon in the form of a waveguide structure with additional reflector layer.

FIG. 7 shows the layer body 105 with a light source 122 for illuminating the finger 112 which is constructed as a waveguide as is shown in FIG. 5. In this preferred embodiment form, a reflector layer 129 is located between sensor layer 115 and the light source 122 for the illumination of the finger 112. This reflector layer 129 is partially transparent and partially reflective such that components of the light of LEDs 125 contribute to the light propagation in the waveguide, while other components are transmitted through the reflector layer 129. The transmitted illumination light 110 passes through the transparent regions 121 of the sensor layer 115 to the placement surface 104 where it undergoes total reflection provided that the total internal reflection is not disrupted by direct contact surfaces of objects placed on the placement surface 104.

Figure 8:
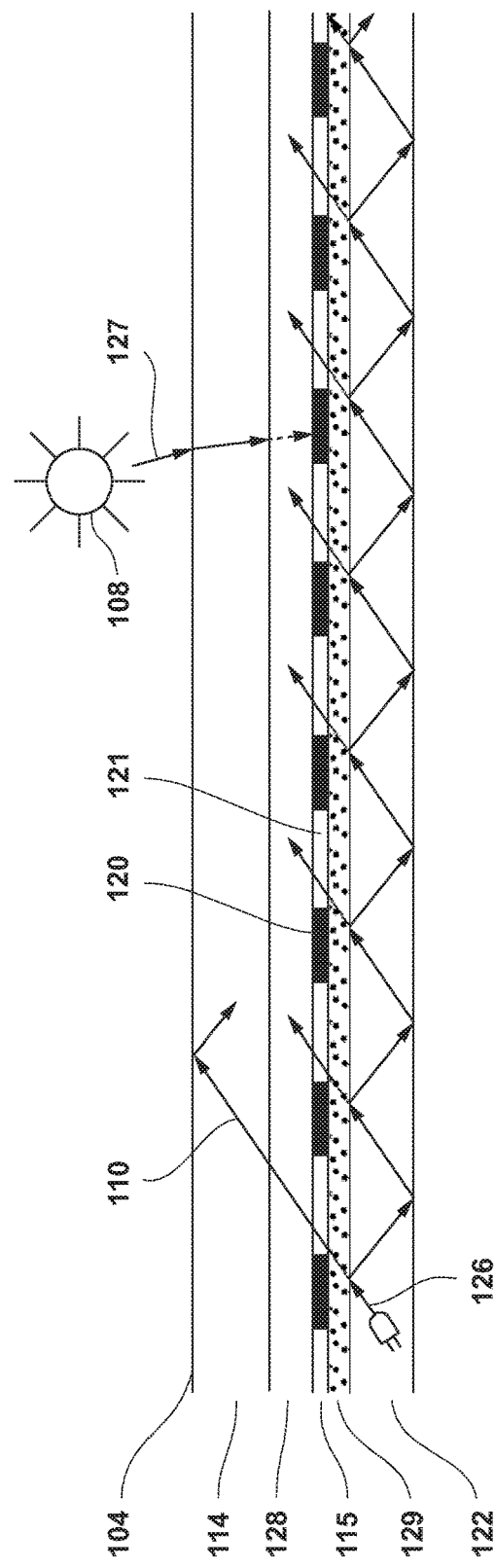
FIG. 8 shows a view of the layer body corresponding to FIG. 7 for illustrating the influence of ambient light (sun)

As in FIG. 7, another constructional variant shown in FIG. 8 uses a light source 122 formed as waveguide for illuminating the finger 112 and a reflector layer 129. In addition, a spectral filter 128 is located in this instance between the protective layer 114 and the sensor layer 115. This spectral filter 128 is adapted to block (and filter out through reflection or absorption) components of ambient light 127, e.g., from the sun.

Figure 9:
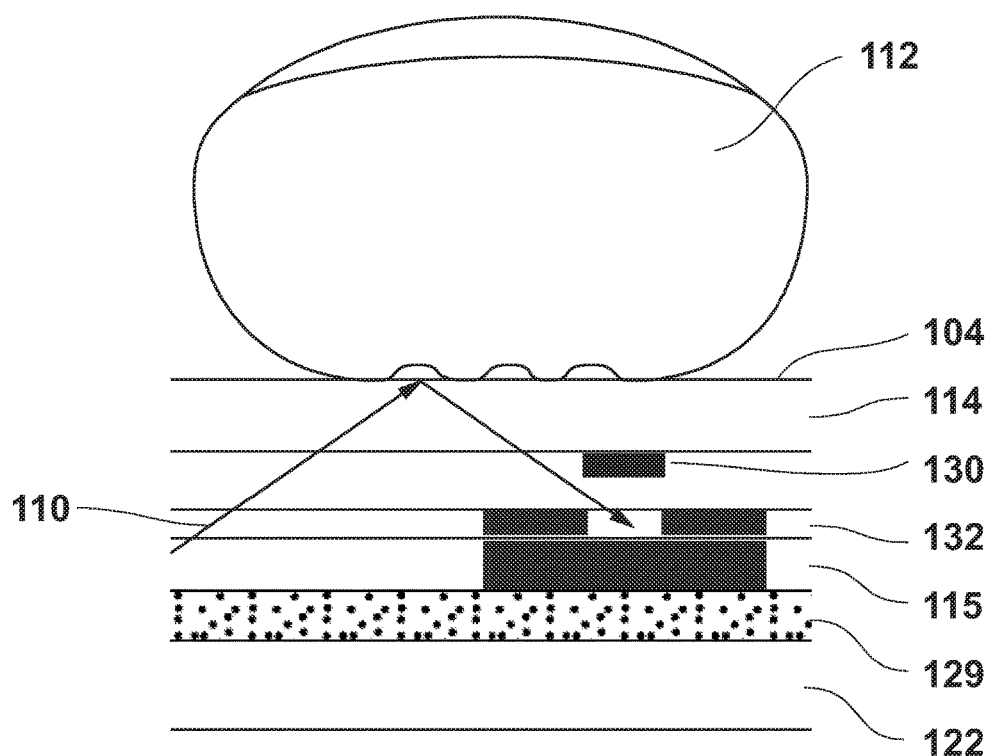
FIG. 9 shows a further construction of the layer body as sensor unit with a light-emitting layer for illuminating objects placed thereon using a reflector layer and an ambient light diaphragm.

FIG. 9 shows a limited portion of layer body 105 as is shown in FIG. 7 with a light source 122 formed as waveguide for the illumination of finger 112 and with a reflector layer 129. In addition, there is a layer with ambient light diaphragms 130 in this instance. The selected portion of the layer body 105 shows an ambient light diaphragm 130 which blocks light that propagates at certain angles from the placement surface 104 in direction of sensor layer 115. The illumination light 110 and the reflection thereof at the placement surface 104 are not to be limited.

The angles that are blocked are defined based on the distance between the ambient light diaphragm 130 and the light-sensitive element of sensor layer 115 and based on the size and shape of the ambient light diaphragm 130. In an improved embodiment form, there is a further layer with pixel aperture stops 132. As is shown in detail in FIG. 9, a pixel aperture stop 132 of this kind is located between the sensor layer 115 and the layer with the ambient light diaphragms 130. Unwanted angle ranges can be blocked more efficiently through the pixel aperture stop 132.

Figure 10:
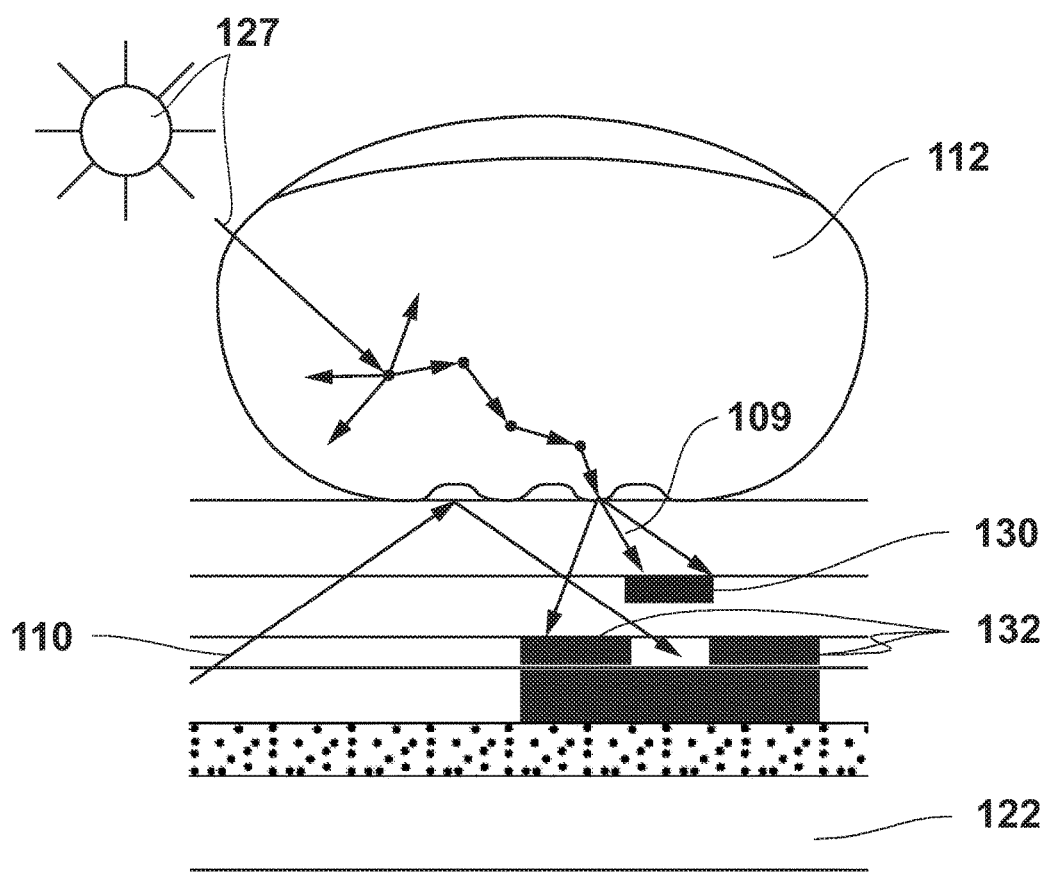
FIG. 10 shows a view of the layer body corresponding to FIG. 9 to illustrate the influence of ambient light when an ambient light diaphragm is in use.

FIG. 10 shows a layer body 105 as in FIG. 9 with angle-selective ambient light protection comprising ambient light diaphragm 130 and pixel aperture stop 132. The light path of interfering ambient light 127 is shown here in order to illustrate the efficiency of the ambient light diaphragm 130 and pixel aperture stop 132. Interfering ambient light 127 occurs in particular when the sun shines directly on the placement surface 104 or on the finger 112 placed thereon. Such light components originating from ambient light 127 are efficiently reduced in the embodiment form according to FIGS. 9 and 10.

Figure 11:
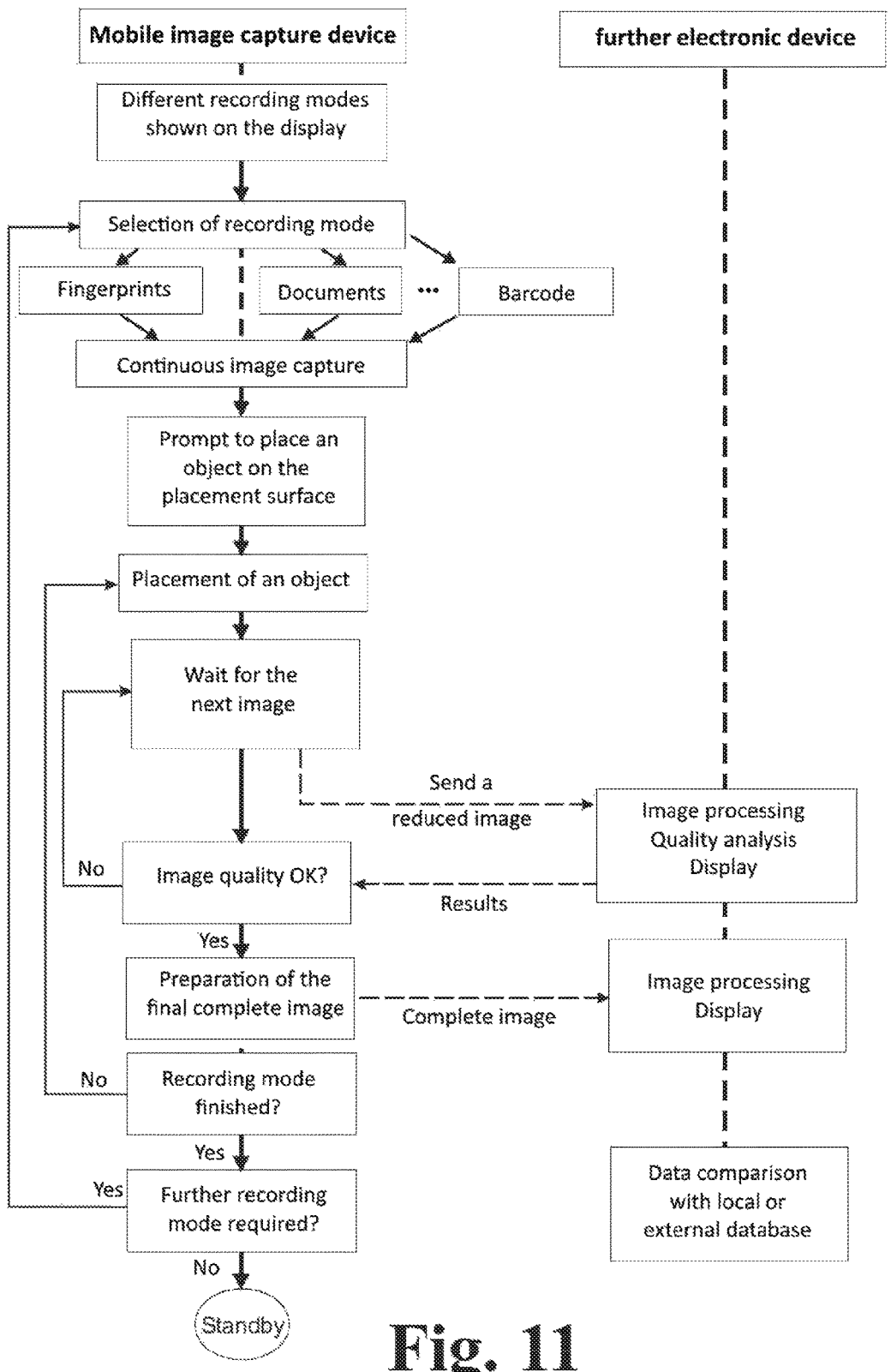
FIG. 11 shows a typical flow schema for an ID check according to the invention with separate image capture and checking of quality and identity or validity of recorded image data.
Figure 12:
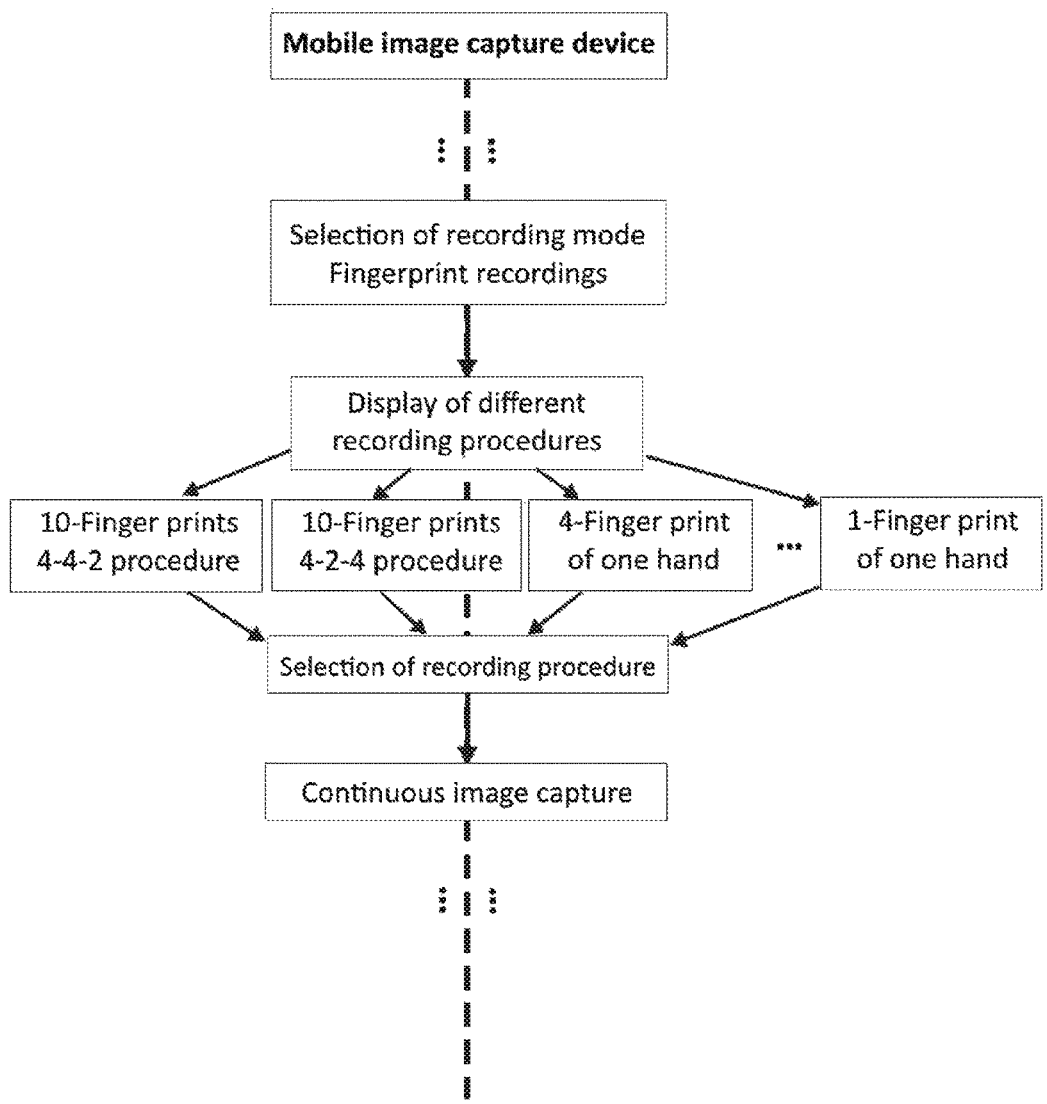
FIG. 12 shows a flow schema for the image recording of autopodia in different placement procedures with selection display for user guidance on the display of the mobile image capture device.
Figure 13:
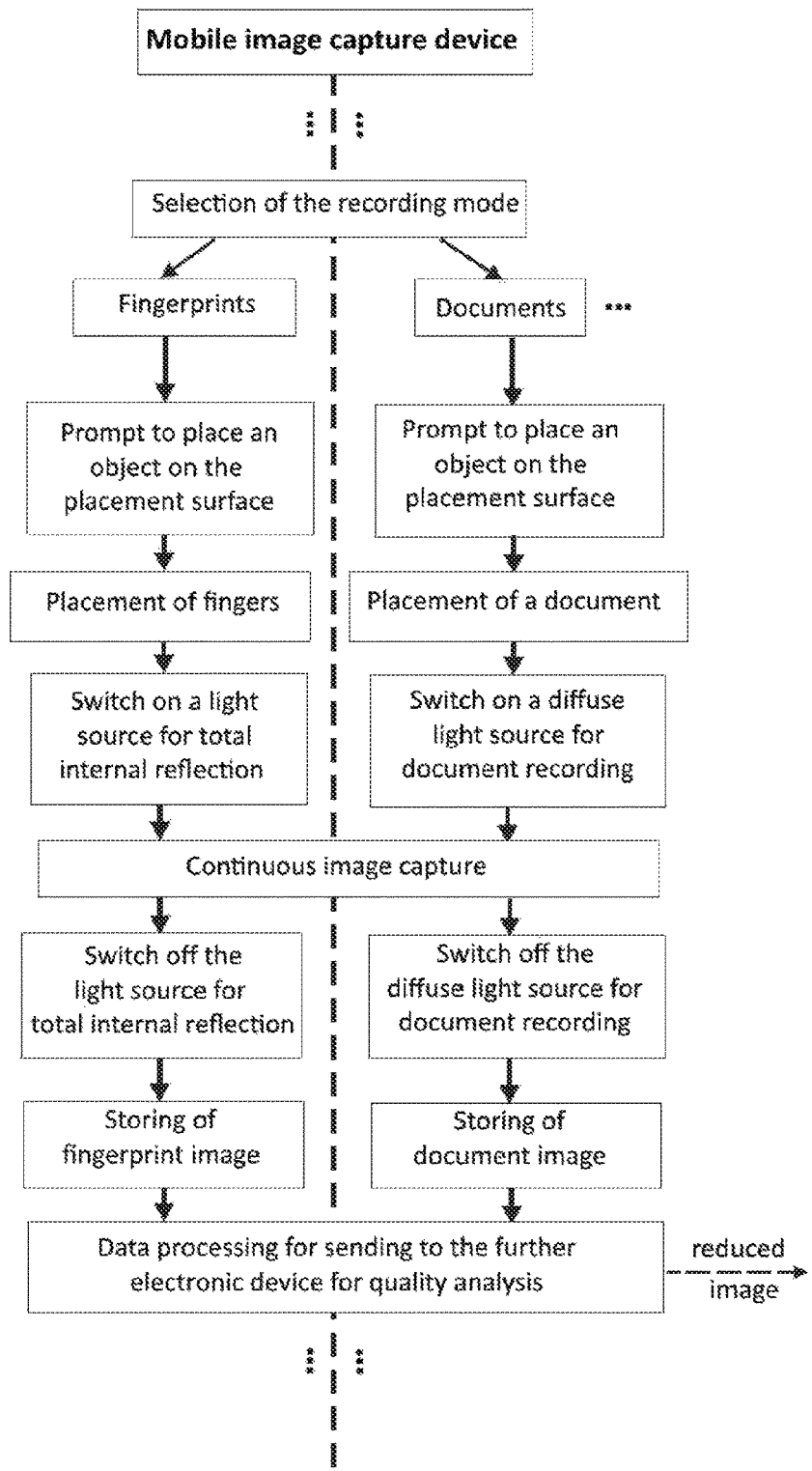
FIG. 13 shows a flow schema for image recording of autopodia and documents with selection display for user guidance on the display of the mobile image capture device.

FIG. 11 shows a typical flow schema for a personal identity check according to the invention with separate image capture and for checking the quality and identity or validity of recorded image data. The method is supported by a user guidance on a display 103 of the image capture device 100. The process commences with the selection of different recording modes, e.g., fingerprint recording, document recording, signature recording or recording of barcodes. The user then selects the appropriate mode. If the image capture device 100 is constructed in such a way that the display 103 is located separately next to the placement surface 104, it is preferably outfitted with a touchscreen. Accordingly, the user can select the required mode directly with the finger. If the display 103 for showing user information is located under the placement surface 104 of the image capture device 100, the user's selection with the finger can also be detected directly by the sensor layer 115. Once the selection has been made, the display 103 shows the variants of the recording procedures, e.g., 4-4-2 when recording fingers, i.e., a procedure in which four fingers of one hand are first recorded, then four fingers of the other hand are recorded and, finally, in a third recording, the two thumbs are recorded. However, there are also other procedures for fingerprint recording, e.g., the simultaneous recording of only two fingers. When the device is in document recording mode, for example, different procedures can also be offered for different documents. As when selecting the mode, the user selects the desired procedure. The image capture device 100 now switches on the illumination for recording and starts the continuous image acquisition. In general, the illumination can already be switched on. But for reduced power consumption in a mobile type scenario, the illumination can also be switched on only for recording. Separate light sources 124, 122 for the illumination of documents 113 and for the illumination of autopodia 112 are preferably contained in the light-emitting layer 116. The image capture device 100 switches on the illumination that is used for the selected recording mode. The display 103 now requires the user to place the document 113 or one or more fingers 112 on the placement surface 104 according to the selected procedure. During the continuous image acquisition, images are continually recorded with the sensor layer 115 and buffered and reduced with the electronic controlling and data processing unit 117. The reduced images are continuously sent to an electronic device connected to the image capture device 100. In a typical situation, according to FIG. 1, this connected device is a mobile phone 101 or a tablet PC 102. The connected electronic device receives the data and starts image processing processes. In particular, the images are evaluated. Typical evaluation methods test for image noise, contrast or gray scale range. The reduced images are preferably shown continuously on the display of the connected device during this process. The recording can accordingly be monitored via the connected device. The results of the quality test are sent back to the image capture device 100. If the results are positive, the image capture device 100 sends the corresponding complete image to the connected device (mobile phone 101, tablet PC 102). If the test is negative, the continuous recording process continues until an image satisfies the quality test or another termination condition takes effect. A termination condition may be, e.g., a time limit after which the user is asked to repeat placement or corrective measures are undertaken to improve the recording (increase placement pressure, moisten dry fingers, etc.).

After the complete image has been sent to the connected device, this device executes a further image processing chain to optimize the image according to requirements (filters, transformations, etc.). In case the recording process has ended, the display 103 of the image capture device 100 shows the confirmation (e.g., green checkmark); if not, the display 103 shows the prompt for placement of the next fingers 112 or documents 113 and the process continues as described above. The status of the process is also preferably indicated on the display of the connected device as are the reduced images and the complete images and the results at the conclusion of the process.

At the conclusion of the process, the further processing of the final image data commences. These image data are preferably compared with a database locally on the device according to FIG. 14 or are also sent to a connected external database and compared. The results are received via the connected further electronic device (mobile phone 101, tablet PC 102 or PC 106) and displayed on the latter or are also sent to the image capture device 100 and shown on display 103.

According to the basic method described in FIG. 11, the further electronic device 101, 102 or 106 will store the processed complete-image data and subsequently convey them to a local database or to a database (e.g., US-IDENT, EU-VIS, credit card database) connected via network. The data are compared with the stored database entries. The results are received by the further electronic device 101, 102 or 106. If the results are not incriminating, e.g., the credit card data are legitimate or the traveler at the border is not being sought on criminal charges, the results are displayed on the connected further electronic device 101, 102 or 106 and on the image capture device 100 and the process in concluded. In cases where a critical result poses a danger to the operator, a silent or hidden alarm is triggered, e.g., in the case of border control on trains: if the traveler has been classified by the database as wanted, the border official receives an alert, e.g., a vibration, preferably on a smartphone (mobile phone 101) in his/her jacket pocket. In case of automobile border crossing, the border official receives the alert on his/her PC 106, and the traveler does not see this alert.

Live skin areas of human autopodia 112 and any documents 113, but ID documents in particular, can be recorded with the image capture device 100 via a placement surface 104. In this regard, a policeman or border official, for example, holds the image capture device 100 for, e.g., the traveler whose identity is to be recorded or hands it to this traveler, e.g., into the interior of an automobile. The image capture device 100 has at least one display 103 which can be located next to the placement surface 104 as is shown in FIG. 1. In a preferred variant as shown in FIG. 3, a display 103 can also be located under the placement surface 104. The information shown on the display 103 can then be viewed directly on the placement surface 104.

FIG. 4 shows a cross section through the image capture device 100. The key component part is a layer body 105 comprising a protective layer 114 forming the placement surface 104, a sensor layer 115 and a light-emitting layer 116. The image capture device 100 further comprises an electronic controlling and data processing unit 117.

At the start of the recording process, a prompt appears on a display 103 of the image capture device 100 to present the appropriate autopodia 112 or a document 113.

As used herein, autopodia 112 refers particularly to human fingers. Ideally, when recording flat fingerprints, the prints of all three phalanges are recorded; at least the skin prints of the third phalanx are detected. In the case of rolled fingerprints, the third phalanx is placed flat on its side and then rolled over the placement surface 104.

In the present case, documents 113 are primarily identity documents (ID documents), e.g., a German government-issued identification card. In the USA, driver's licenses are commonly used. However, a document 113 can also be a boarding pass for an airplane, a ticket or a barcode located, e.g., on a printout or other object.

Before the image recording is made, illumination in the form of the light-emitting layer 116 of the layer body 105 is switched on for the image recording. Switching on can be carried out before or after placement of the autopodia 112 or document 113. In general, different light sources 122 or 124 can be provided in the image capture device 100 for the recording of autopodia 112 and for the recording of documents 113. The corresponding light source 122 or 124 can be switched on in the light-emitting layer 116, or the light sources 122, 124 can be switched over from one to the other depending on the object to be recorded.

Layer Body

The image capture device 100 has a layer body 105 as is shown in FIG. 4 which comprises a sensor layer 115, a protective layer 114 which is located above the latter and outwardly forms the placement surface 104 and, under this, at least one light-emitting layer 116 which has light source components for illuminating autopodia 112 and documents 113 as well as a layer for accommodating an electronic controlling and data processing unit 117.

The image recording is carried out by means of a sensor layer 115 which is protected from environmental influences by a protective layer 114. The protective layer 114 outwardly forms the placement surface 104. At least one light-emitting layer 116 is located under the sensor layer 115. For the image capture of skin areas of autopodia 112, light is coupled out of the light-emitting layer 116 in a defined angle range. This light propagates through the sensor layer 115 and protective layer 114 to the placement surface 104. The placement surface 104 is an optical interface between different materials: the material of the protective layer 114 on the one hand and, on the other hand, the material of the environment of the image capture device 100 or the material of the presented object located on the placement surface 104. Reflection and transmission take place at this optical interface. Portions of the illumination light 110 of the light-emitting layer 116 are reflected at the interface formed by the placement surface 104 and can be detected by the sensor layer 115. Other components of the illumination light 110 pass the interface formed by the placement surface 104. If there is no object, finger 112 or document 113 placed on the placement surface 104, this transmitted light passes into the environment. If a finger 112 or document 113 is placed on the placement surface 104, the illumination light 110 is reflected back or backscattered by it. The scattered light 109 which is backscattered or reflected in this way can in turn be detected by the sensor layer 115.

Light Sources

The principle of frustrated total internal reflection is used for recording skin prints. This principle is shown in FIG. 5. The light source 122 for illuminating autopodia 112 emits illumination light 110 in a limited angle range around a preferred direction. The light source 122 for illuminating autopodia 112 can be constructed as a waveguide as is shown in FIG. 5. Light is coupled into the light-emitting layer 116 as waveguide via LEDs 125. The illumination light 110 is distributed in the waveguide 126 in accordance with the physical principles of light propagation. The waveguide is constituted in such a way that components of the light propagating in the waveguide, as illumination light 110, can pass out of the waveguide.

The illumination light 110 undergoes total internal reflection at the placement surface 104 as a result of the difference in the refractive index between the environment of the image capture device 100 (e.g., air) and the protective layer 114 as long as the following precondition is met:

$$\theta_c = \arcsin\left(\frac{n_2}{n_1}\right),$$

where $\theta_c$ is the angle of the light in the protective layer 114 measured relative to the perpendicular to the placement surface 104, $n_2$ is the refractive index of the environment of the image capture device 100, where air is $n_2=1$, and $n_1$ is the refractive index of the protective layer 114. For float glass (e.g., BK7), $n_1$ in the visible wavelength region is approximately 1.5. Accordingly, for $\theta_c$, there is an angle of about 42°.

For angle components of the illumination light 110 greater than 42° relative to the perpendicular of the placement surface 104, the illumination light 110 is totally reflected within the protective layer 114. The internally reflected light 111 is detected by the sensor layer 115. This applies in case there is no skin surface of an autopodium 112 at the respective location in direct optical contact with the placement surface 104. This is the case at those locations where no fingers 112 are placed, but is also the case for valleys 118 of the fingerprint profile. However, when the illumination light 110 strikes a ridge 119 of the fingerprint profile, the illumination light 110 couples into the skin tissue of the finger 112 at this location. Scattered light 109 occurs at this location. Portions of the scattered light 109 arrive back in direction of the placement surface 104. They pass the placement surface 104 and the protective layer 114 and are detected by the sensor layer 115. The intensity of the scattered light 109 from the finger 112 on the sensor layer 115 is less than the intensity of the internally reflected light 111. This allows a contrast between ridge 119 and valley 118 of the fingerprint profile to be imaged.

For the recording of documents 113 as shown in FIG. 6 the illumination light 110 needs fractions which are not totally internally reflected at the placement surface 104. These fractions pass through the placement surface 104 and produce scattered light 109 at the surface of the document 113. Fractions of the scattered light 109 return in direction of the placement surface 104. They pass the placement surface 104 and the protective layer 114 and are detected by the sensor layer 115. Depending on the color and brightness of the document 113, the illumination light 110 produces scattered light 109 of varying strength at different locations on the document 113. An image of the document 113 (impression, text, pattern) can accordingly be recorded.

Different angle ranges of illumination light 110 are used for imaging the fingerprint profile and for imaging (printed) flat documents 113. The best contrast between the ridge 119 and valley 118 of the fingerprint profile is obtained when all of the angle fractions of the illumination light 110 satisfy the precondition for total internal reflection at the placement surface 104. However, it is then impossible to record flat documents 113. If the illumination light 110 has no angular components that satisfy the precondition fortotal internal reflection at the placement surface 104, but does have angular components that can pass the placement surface 104, it is possible to image flat documents 113 but is not possible to record the fingerprint profile.

The light-emitting layer 116 can be constructed in such a way that it emits angle components for recording the fingerprint profile as well as angle components for recording documents 113. The layer body 105 shown in FIG. 4 has a light-emitting layer 116 with only one light source 122, wherein it is ensured that it comprises light components which meet the prerequisite for total internal reflection as well as light components which do not undergo total internal reflection. This embodiment form has the advantage that only one light source 122 is needed and, accordingly, costs, volume and weight are lower than in embodiment forms having more than one light source.

In a preferred embodiment form of the image capture device 100, there are two light sources in the light-emitting layer 116, one light source 122 for illuminating autopodia 112 and one light source 124 for illuminating documents 113. Corresponding layer bodies 105 with a light-emitting layer 116 which is divided in two and which comprises two light sources 122 and 124 are shown in FIG. 5 and FIG. 6. Depending on the object, autopodium 112 or document 113 to be recorded, the appropriate light source 122 for the illumination of autopodia 112 is switched on and the other light source 124 for the illumination of documents 113 is switched off. The two light sources 122 and 124 can be optimized, respectively, with regard to the angular spectrum either for document recording or for the recording of skin prints of multi-segment autopodia 112. The light source 122 for the illumination of autopodia 112 then ideally generates an illumination light 110 which satisfies the prerequisite for total internal reflection at the placement surface 104. The contrast between ridge 119 and valley 118 of a skin print profile is then maximized for this system. The light source 124 for the illumination of documents 113 ideally comprises only angle components which do not meet the precondition for total internal reflection at the placement surface 104 but, rather, emit at exit angles which diverge appreciably from total reflection angles.

In case of a light-emitting layer 116 with a system of two light sources 122 and 124, the light of one light source 124 must pass the other light source 122. In a preferred embodiment form, shown in FIG. 5 and FIG. 6, the light source 122 for the illumination of autopodia 112 is directly connected to the sensor layer 115 and is sufficiently transparent to light of the light source 124 for the illumination of documents 113. In this variant, the light of the light source 124 for the illumination of documents 113 passes the light source 122 for the illumination of autopodia 112, the sensor layer 115 and the protective layer 114 and illuminates the document 113 through the placement surface 104. A further layer, e.g., an air gap 123, with a smaller refractive index than that of the light source 122 for the illumination of autopodia 112 which is formed as a waveguide is located between the two sources 122 and 124. If a waveguide system is used as light source 122 for the illumination of autopodia 112, the air gap 123 ensures that there is no interference of this waveguide, i.e., no light is coupled out on the side remote of the sensor layer 115.

Homogenization

In a particularly preferred embodiment form, a waveguide is used as light source 122 for the illumination of autopodia 112. In a constructional variant, a reflector 129 is located between the sensor layer 115 and the light source 122 for the illumination of autopodia 112 so that light from the light source 122 for the illumination of autopodia 112 can couple out in direction of the placement surface 104 so as to illuminate this placement surface 104. This concept is shown in FIG. 7. Accordingly, the reflector layer 129 forms a further layer of the layer body 105 and is optically coupled with sensor layer 115 as well as with the light source 122 for the illumination of autopodia 112.

When two layers are optically coupled, this means that there is no air gap between them. In case the two layers are glued together or connected to one another by another joining process and an additional material (e.g., glue) is accordingly located between the two layers, this material has a refractive index between that of the two layers, or its refractive index is similar to that of the two layers.

The reflector 129 is constructed in such a way that it reflects a portion of the light and transmits a portion of the light. Accordingly, a portion of the illumination light 110 can propagate farther in the light-emitting layer 116 which accordingly acts as waveguide, while the other portion illuminates the placement surface 104 through layer body 105. The reflectance of the reflector 129 should be at least 50%, and the transmission should be greater than 5%. A reflector layer 129 of this kind may be constructed as a metal layer, for example. In order for the transmittance of the metal reflector layer 129 to be sufficiently high, the metal layer must be sufficiently thin. A thickness of several nanometers to several tens of nanometers meets these basic reflection and transmission requirements for common metals (e.g., silver, gold, aluminum, brass, copper).

In a particularly preferred embodiment form, the ratio of reflectance and transmittance of the reflector layer 129 can be defined by the structure of a metal layer rather than by the thickness. In this variant, the metal reflector layer 129 has a thickness of at least several tens of nanometers and its transmittance is accordingly less than 1%. However, a reflector layer 129 of this type has a structure such that there are transparent regions and reflecting regions. Accordingly, an effective (i.e., averaged) transmittance and reflectance can be adjusted for this layer design of the reflector 129 via the area ratio between reflecting regions and transparent regions.

In order to realize an illumination that is as homogeneous as possible over the entire placement surface 104, the structures in the metal of the reflector layer 129 should be smaller than the center-to-center pixel spacing of the light-sensitive elements of the sensor layer 115 so that the structures do not appear too strongly in the image captured by the sensor layer 115. The broader the angle range of the emitted illumination light 110 of the light-emitting layer 116, the fewer intensity fluctuations generated by the reflector layer 129 in the sensor layer 115.

For an illumination of the placement surface 104 that is as homogeneous as possible, the structures of the reflector layer 129 can vary over its surface area. In particular, a more homogeneous illumination is generated when the reflectance in the vicinity of the LEDs 125 which couple the illumination light 110 into the light-emitting layer 116 acting as waveguide is greater and the transmittance is smaller. Complex distribution structures can be carried out in this way in order to realize an illumination of the placement surface 104 that is as homogeneous as possible depending on the angular spectrum of the illumination, the thickness of the waveguide formed in the light-emitting layer 116 and the thicknesses of the other layers in the layer body 105.

Sensors

An optical image recording concept in which conventional optically imaging elements such as lenses and prisms are entirely omitted is used so that the image capture device 100 can be as thin and lightweight as possible. The sensor layer 115 is approximately as large as the placement surface 104 and thus allows a 1:1-imaging of the objects located on the placement surface 104. Light components from the light-emitting layer 116 which are reflected internally at the placement surface 104 as well as light components which are backscattered from the objects such as autopodia 112 or documents 113 are detected. But light components of the ambient light 127 which directly pass the placement surface 104 or which pass the placement surface 104 and the protective layer 114 through the placed object are also detected.

The sensor layer 115 is preferably based on TFT technology. This makes it possible, in contrast to CCD technology or CMOS technology, to use large-area sensors on the one hand and substrate materials aside from the silicon semiconductor on the other hand. Accordingly, a substrate which is transparent to the visible wavelength spectrum is possible. Glass is preferably used as substrate material for the sensor layer 115.

The sensor layer 115 comprises a two-dimensional regular pixel array. The pixel array has light-sensitive regions 120 and transparent regions 121. The light-sensitive regions 120 are preferably photodiodes. Owing to the transparent regions 121 and to the use of a transparent substrate, the entire sensor layer 115 on the average is transparent. The effective transmittance of the sensor layer 115 is greater than 10%, preferably greater than 20%.

Protective Layer

The sensor layer 115 is protected from environmental influences by a protective layer 114. Disruptive or destructive environmental influences can act mechanically, chemically and electrically. To be mechanically robust, the protective layer 114 must be as hard and scratch-resistant as possible. The recording of documents 113 presents a challenge in this respect because they are harder than the skin of autopodia 112 and hard dirt particles can generate scratches when the document 113 is guided along the placement surface 104. In the present instance, a Mohs hardness of at least 6 is required. To ensure more extensive protection, a Mohs hardness of at least 7 is preferred. For chemical protection, the sensor layer 115 must be adequately encapsulated. Moisture, cleaning agents, etc. may not come in contact with the sensor layer 115. It must likewise be protected against electrical discharge. An insulator, e.g. glass, having a thickness of at least 25 µm ensures a sufficient protection in this regard.

A preferred protection system for the sensor layer 115 which adequately protects against all of the above-mentioned environmental influences is thin glass having a thickness of greater than 25 µm. It offers a very good encapsulation, a Mohs hardness ≥6 and, moreover, affords the necessary protection against electrical discharges. Thicker glass is preferable in order to further increase resistance to mechanical impact and discharge protection. To improve scratch resistance, tempered glass, sapphire or glass coated with toughening layers is especially preferable. A protective component of this kind is glued to the sensor layer 115 or is optically connected by another joining process. A glue 133 between protective layer 114 and sensor layer 115 forms an additional layer in the layer body 105 as is shown in FIG. 7.

Ambient Light Protection

Aside from internally reflected light 111 or scattered light 109, both of which originate from the internal light-emitting layer 116, ambient light 127 also reaches the sensor layer 115, e.g., from the sun (see FIG. 8). The ambient light 127 can reach the sensor layer 115 directly through the placement surface 104 or also through the autopodia 112 or the document 113. This can result in loss of information in case the light-sensitive regions 120 of the sensor layer 115 are saturated and accordingly cannot receive any more information. In this case, a spectral filter 128 can offer efficient protection. This spectral filter 128 can be arranged, e.g., between the protective layer 114 and the sensor layer 115. Since when recording documents the document 113 itself offers good protection against ambient light, the aim is primarily to find an effective ambient light protection for the recording of autopodia 112. Ambient red light passes very easily through human tissue. Therefore, an efficient spectral filter 128 would be adapted to extensively block red light. The spectral filter 128 can be constructed, e.g., as absorption filter or as interference filter.

In a preferred embodiment form, the spectral filter 128 is arranged as fluid in the glue 133 between the protective layer 114 and the sensor layer 115 so that no additional layer is needed.

In a further specific embodiment form, the spectral filter 128 can be structured such that only the light-sensitive regions 120, but not the transparent regions 121, of the sensor layer 115 are provided with the spectral filter 128. Accordingly, light from the light-emitting layer 115 can be perceived by the user via the placement surface 104 without spectral filtering. This enables a color display, for example, in case the light-emitting layer 116 is formed by the display 103 as described referring to FIG. 3.

A further efficient variant for an ambient light protection is an ambient light diaphragm 130 as in FIG. 9 and FIG. 10. In contrast to spectral filtering, this concept operates on the basis of angle-selective filtering. For this purpose, there is at least one additional layer with an ambient light diaphragm 130. This ambient light diaphragm 130 is arranged at a distance from the light-sensitive region 120 corresponding approximately to an edge length of the light-sensitive region 120. Light components which impinge on the light-sensitive region 120 at angles which do not even occur in the angle spectrum of the illumination light 110 but which originate through the ambient light 110 can be blocked in this way. In addition, a further layer can be arranged directly on the light-sensitive region 120 in order to block unwanted angle ranges even more selectively.

Display/User Guide/Interaction

In a preferred embodiment form, the user can control the image capture device 100 and the image capture process via the display 103 by means of touch (touchscreen). The display 103 adjacent to the placement surface 104 serves to show input prompts or suggested corrections. Suggested corrections may be, e.g., cues for pressing the autopodia 112 harder or softer or changing the finger position.

A direct interaction with the user is made possible by a display functionality directly on the placement surface 104 by constructing the light-emitting layer 116 as a display 103 or by combining display 103 and sensor layer 115 in one layer. In this way, placement errors can be displayed directly at the correct location. The rolling process for recording rolled fingerprints can be supported interactively by indicating the position and speed of rolling.

Power Supply

The arrangement according to the invention further has an accumulator or a battery in its mobile image capture device 100 so that it can be operated cordlessly. In case of an accumulator, it can be charged by a charging device via an external interface (e.g., USB). The image capture device 100 with the utilized components and usual power saving functions can preferably be used for an entire day without using a charger or other cable connection. However, this time period can also be appreciably shortened by choice with a docking station or a replaceable accumulator as already mentioned above.

Method

The mobile image capture device 100 is wirelessly connected to a further electronic device, either a mobile phone (smartphone) 101, tablet PC 102 or stationary computer 106 with display screen 107. Images of documents 113, particularly ID documents, and skin areas of human autopodia 112 are recorded via the image capture device 100 and sent to the connected electronic device, a mobile phone 101, a tablet PC 102 or a computer 106.

Sending takes place as live sequence with a latency in a range of <1 s. The images must be reduced on the image capture device 100 before being sent because of the limitation of the bandwidth of the wireless connection. Reducing the image recorded in the image capture device 100 refers to the file size. Preferred variants for reducing file size are, e.g.:

(a) reducing the resolution (every nth pixel, every nth line is discarded), (b) reducing the dynamics (reducing the quantity of gray levels, e.g., converting from 9-bit to 8-bit), (c) cutting out relevant image information (discarding image portions which do not contain relevant information), (d) compressing (common compression algorithms such as, e.g., lossless PNG compression).

At least the last image recorded with the image capture device 100 is retained in memory in the image capture device 100 as complete image (i.e., with full resolution and full dynamic range) and is sent along as complete image upon an OK signal from the quality check from the coupled further electronic device 101, 102 or 106. Older recordings are deleted or overwritten.

The data sent to the connected electronic device 101, 102 or 106 as live sequence are evaluated by this device. For example, an evaluation can be carried out based on:

(a) analysis of the image noise, (b) grayscale analysis (histogram), and (c) contrast analysis (e.g., ridge-valley contrast of the fingerprint).

The evaluation can be carried out, e.g., by means of comparison. When a comparison value (threshold value) is reached, a signal is sent to the image capture device 100.

In a preferred variant in which only the last complete image is stored in the image capture device 100, the connected electronic device 101, 102 or 106 always evaluates the last image received from the live sequence. If this image satisfies the quality requirement, then after the signal has been sent to the image capture device 100, the last stored complete image is sent from the image capture device 100 to the connected device 101, 102 or 106. To this end, the sending of the final reduced image, the evaluation thereof in the connected device 101, 102 or 106 and the receipt of the signal by the image capture device 100 must be carried out faster than the time interval between two images of the live sequence. Otherwise, the stored complete image would already be overwritten again by a new complete image after the signal is received by the image capture device 100, and the complete image that was evaluated by the connected electronic device 101, 102 or 106 would accordingly be deleted.

In a particularly preferred variant of the method, a plurality of complete images are stored in the image capture device 100 with a unique identifier. The reduced images sent in the live sequence also carry this identifier. The identifier of the image that has passed the quality test on the connected electronic device 101, 102 or 106 is sent to the image capture device 100. This image capture device 100 then in turn sends the complete image to the connected electronic device 101, 102 or 106.

The procedures described herein can be repeated for different recordings corresponding to a determined process chain (work flow). The 4-4-2 work flow is typical, for example. In this case, four fingers of one hand (autopodia 112) are scanned in a first image recording, the four fingers 112 of the other hand are then scanned in a second image recording and then the thumbs of both hands (autopodia 112) are subsequently scanned as third image recording. The prompt to position the corresponding fingers 112 and the response when the quality check is carried out in the coupled further electronic device 101, 102 or 106 and the quality criteria are met (e.g., green checkmark on display 103) are carried out via the display 103 of the image capture device 100.

The complete images are further processed on the connected electronic device 101, 102 or 106. In this case, processing can be the fusion of different recordings or the combination of recordings and information and compression. Processed images can be routed to databases or storage systems via the connected electronic device 101, 102 or 106 or can also be compared with databases stored locally on the connected electronic device 101, 102 or 106.

The results of a database comparison (e.g., hits in a criminal database) can be evaluated on the connected device 101, 102 or 106 or can be sent to the image capture device 100. A concealed alarm on the image capture device 100 or on the coupled further electronic device 101, 102 or 106 is also possible.

The image capture device 100 can be controlled and monitored via the wirelessly connected further electronic device 101, 102 and 106 (monitoring of the recording process, examination and control of recorded data, emergency deletion of data in case of loss, blocking of image capture device 100, interaction with the image capture process). The control and monitoring can also extend at the same time to a plurality of wireless image capture devices 100. Accordingly, data from a plurality of image capture devices 100 can be combined, the processes can be efficiently monitored, and the data can be sent in bundles. Further data can be added in turn, e.g., via a keyboard or a photograph, e.g., of the face, via the wirelessly connected electronic device 101, 102 or 106. These data are then combined with the fingerprint and/or document data and/or signature data and sent or evaluated.

On the other hand, the image capture device 100 can also control and monitor a wirelessly connected device. The sending of data by means of the connected electronic device 101,102 or 106 (which is in turn connected with databases, e.g., via the Internet) can be initiated via the image capture device 100. For this purpose, the connected electronic device 101, 102 or 106 of the arrangement according to the invention can communicate the status of its connection with a database (Internet connection, security level, battery status). Evaluation results can be sent to the arrangement according to the invention and, for example, a hidden alarm can be triggered. For example, a border official can be warned by this alarm while recording the data of a traveler in case this traveler is a registered criminal.

Embodiment Example 1

A typical field of use for the mobile application of the arrangement according to the invention and of the method according to the invention is the crossing of an international border, e.g., the border between the USA and Mexico, in private border traffic by motor vehicle (automobile).

The automobile is occupied by four passengers, for example. Each of the four travelers is to be identified by the fingerprint of ten fingers 112 recorded flat. Further, the driver's license is also to be recorded at the same time in this checking process.

A border control booth in which a border police officer sits is located at the border crossing. A barrier in front of which the automobile stops is located on the road. The border police officer has the mobile image capture device 100 and a PC 106 as coupled further electronic device in his/her border control booth. The PC 106 and the image capture device 100 are wirelessly connected to one another via WLAN, and the PC 106 is in turn connected via Internet to US-IDENT (fingerprint database of the DHS).

The police officer has the driver's license handed to him/her. The police officer switches on the mode for recording ID documents 113 on the mobile image capture device 100 and records images of the ID documents 113 of the passengers consecutively. Subsequently, the police officer activates the mode for recording fingerprints and hands the mobile image capture device 100 into the automobile. Each passenger in turn records prints of their ten fingers 112. A display 103 on the image capture device 100 shows when each finger 112 is to be recorded. The police officer in the border control booth monitors the recording process on the PC 106. In so doing, the police officer can see the live images and, for example, can request that certain recordings be repeated on the display 103 of the image capture device 100.

The sequence for the recording of fingerprints in the above-described scenario is typically 4-4-2: first, four fingers of one hand, then four fingers of the other hand and, finally, both thumbs. Accordingly, three images are recorded per person in this case.

When all of the recordings are successfully concluded, the fingerprint data are compared with the database. The database sends a result to the PC 106 which is shown on the computer display screen 107.

This identification process is substantially more secure than individual finger recordings which are mostly used at the present time. An erroneous association of the fingers 112 due to an incorrect sequence during the recording is ruled out. The two 4-finger recordings and 2-thumb recording are faster than the single finger recording because only three images are recorded instead of ten images. Further, there is greater security for the official because the official need not leave the border control booth for the procedure. Data security is high because travelers have no direct access to the PC 106 and therefore can also not steal it. None of the travelers' data is stored on the mobile image capture device 100 after the complete-image data of the three individual print images have been loaded onto the PC 106. The costs associated with this border control are lower than they would be in case of two separate devices for document recording and fingerprint recordings.

Further, there is an appreciable increase in comfort for border personnel. The official has control over the fingerprint recording of the travelers at all times because of the mirroring of the recording procedure on the PC 106. Placing the ID documents 113 flat on the placement surface 104 simplifies recording and prevents blurriness, reflections and ambient light problems compared to photographing the documents 113. The travelers need not exit the vehicle to carry out the recording on the image capture device 100.

Embodiment Example 2

A further typical scenario for application of the arrangement according to the invention is in retail business, for example. The customer wants to purchase a product and pay for it. The seller is not at a conventional register, but rather moves freely around the store with the mobile image capture device 100. This mobile image capture device 100 is in turn wirelessly connected to a tablet PC 102 as coupled further electronic device for checking data quality and verifying personal data.

The customer pays the seller by credit card, the customer's fingerprint is recorded and the customer signs. The tablet PC 102 is connected to the credit card bank. The seller takes the product that the customer would like to buy and records its barcode with the image capture device 100 according to the invention. The price and payment methods are indicated on the display 103 of the image capture device 100. The seller chooses the payment method by means of touchscreen, records an image of the customer's credit card and scans four flat fingerprints of one of the customer's hands. All of the recordings of the mobile image capture device 100 are forwarded to the tablet PC 102. The fingerprint data and the credit card data are sent via the tablet PC 102 to the credit card bank, where they are checked against a database. The database sends the results of the check to the tablet PC 102. The tablet PC 102 sends the results to the mobile image capture device 100, where it is displayed. The customer then confirms the payment by signing on the mobile image capture device 100. The printing process for a receipt for the customer is then initiated via the tablet PC 102.

Security is significantly increased in the scenario described above, since the recording of a plurality of fingers is more secure than the individual finger recording customary at the present time. Security is also increased through the detection of three payment control factors: credit card, fingerprint and signature. The credit card is read optically, not in a contactless manner, which reduces the risk of data theft. The tablet PC 102 is located in a secure place so that it cannot be stolen. The mobile image capture device 100 does not contain any data about previous customers. Costs can be lowered because only one device is used for recording barcodes, fingerprints, documents and signatures. Comfort is increased because the customer need not wait in line. The seller can control the sale process actively from start to finish.

Embodiment Example 3

Another typical application is mobile border control in trains. For example, in a train traveling from Russia to Finland, travelers with visas must be identified by fingerprinting (ten flat fingers) and visa (in the passport), and the visa must be verified. The border police officer has two hours to check all of the travelers. The border police officer has the mobile image capture device 100 and a mobile phone 101 (smartphone) as further electronic device for the data work flow. The mobile phone 101 is connected to the mobile image capture device 100 via Bluetooth. The mobile phone 101 is in turn connected to EU-VIS (visa database of the EU).

The police officer records the personal data of the travelers with the mobile phone 101 and activates the fingerprint/document recording on the mobile phone 101 so that the connected mobile image capture device 100 switches to the corresponding mode, and the mobile phone 101 is stowed in the uniform jacket of the police officer. The police officer records ten flat fingers 112 of each traveler in three steps (4-4-2) and then records the visa with the large-area optical sensor layer 115 of the mobile image capture device 100. The mobile phone 101 receives the fingerprint data and visa data (document image) and sends them to the database. The database compares the data with the stored data and sends the results to the mobile phone 101. If the results are unremarkable, the mobile phone 101 forwards the results to the mobile image capture device 100, and the mobile image capture device 100 shows the results on the display 103. If a problem has been determined during the database check, the mobile phone 101 generates a "silent alarm" or sends an error message to the image capture device 100.

One advantage is the recording of ten fingers 112 instead of the individual finger recording carried out heretofore. The ten-finger procedure requires only three recordings (4-4-2), and the process is accordingly faster than sequential image recording. The method provides greater security for the official because, with two devices in use simultaneously, he/she always only needs to operate one device and accordingly has one hand free. Moreover, the data are also secure: the mobile phone 101 cannot easily be stolen and there is no storage of fingerprint data or mobile data on the mobile image capture device 100. There is also a cost advantage in that only one device is needed for fingerprinting and document recording instead of two devices. Flat positioning ID documents 113 (passports and visas) simplifies recording and prevents blurriness, reflections and ambient light problems compared to a recording by a conventional camera (e.g., smartphone camera).

LIST OF REFERENCE NUMERALS 100 image capture device
101 mobile phone (smartphone)
102 tablet PC
103 display
104 placement surface
105 layer body
106 computer (PC)
107 display screen
108 wireless connection
109 scattered light
110 illumination light
111 (internally) reflected light
112 autopodium (finger)
113 document
114 protective layer
115 sensor layer
116 light-emitting layer
117 (electronic) controlling and data processing unit
118 valley
119 ridge
120 light-sensitive region
121 transparent region
122 light source for illuminating autopodia
123 air gap
124 light source for illuminating documents
125 LED (light emitting diode)
126 light propagation in the waveguide
127 ambient light (sun)
128 spectral filter
129 reflector (layer)
130 ambient light diaphragm
132 pixel aperture stop
133 glue (between protective layer 114 and sensor layer 115)

What is claimed is:

1. An arrangement for optical recording of live skin areas of human autopodia and of documents, comprising:
   a layer body with a sensor layer comprising light-sensitive elements arranged in a two-dimensional regular pixel raster;
   a transparent protective layer above the two-dimensional pixel raster of light-sensitive elements of the sensor layer, the protective layer having an outer surface of the layer body parallel to and at a defined distance from the light-sensitive elements, the outer surface providing a placement surface for the live skin areas of multi-segment autopodia or for the documents to be recorded;
   an area light source capable of coupling portions of light from a direction of the sensor layer through the protective layer into the skin areas of the autopodial to be recorded or the documents, wherein all layers of the layer body located between the area light source and the placement surface transmit at least portions of light of a required wavelength range; and
   a control unit for image readout, image processing and control of the light source;
   wherein the layer body is integrated in a mobile image capture device comprising:
      at least one display for displaying user guidance for a user;
      an internal power supply for powering the mobile image capture device for a desired period of use without an external power feed;
      the layer body supplemented under the sensor layer by the area light source as a light-emitting layer, wherein the light-emitting layer is configured to emit:
         light in a first angle range such that portions of light in the protective layer are internally reflected at the placement surface to record skin areas of the autopodial placed on the placement surface using the principle of frustrated total internal reflection, and
         light in a second angle range such that portions of light illuminate the document placed on the placement surface through the placement surface;
      the mobile image capture device having an electronic controlling and data processing unit for preprocessing captured image data, and for reducing the captured image data for wirelessly sending the captured image data to a further electronic device; and
      the mobile image capture device being coupled to the further electronic device for image data processing with quality assessment and image data management via an interface for wireless data transmission and communication.

2. The arrangement according to claim 1, wherein the light-emitting layer of the image capture device comprises two light sources, the two light sources comprising a first light source for illuminating recordings of skin prints of the autopodia based on a principle of frustrated total internal reflection and a second light source for capturing images of documents.

3. The arrangement according to claim 1, wherein the sensor layer of the image capture device comprises transparent regions so that a proportion of at least 10% of the light of a light-emitting layer can pass through the sensor layer.

4. The arrangement according to claim 1, wherein the protective layer comprises an optical glass or sapphire or a transparent ceramic.

5. The arrangement according to claim 4, wherein the protective layer has an optical cement layer for connecting to the sensor layer.

6. The arrangement according to claim 4, wherein the protective layer is formed as an upper window of a protective housing of the image capture device.

7. The arrangement according to claim 1, wherein the further electronic device is a mobile phone, a tablet PC, a stationary computer or a laptop.

8. The arrangement according to claim 1, wherein the further electronic device has a display for showing the images captured by the image capture device so that the recording process can be displayed in real time on the further electronic device.

9. The arrangement according to claim 1, wherein a power supply having at least one replaceable primary battery or a chargeable accumulator is provided in the mobile capture device.

10. The arrangement according to claim 9, wherein the at least one chargeable accumulator of the mobile image capture device can be charged via a network cable, a USB interface or by means of a docking station.

11. The arrangement according to claim 1, wherein the at least one display in the mobile image capture device serves to display information for user guidance and is arranged in parallel to the sensor layer on a side of the sensor layer remote of the protective layer so that information on the display can be perceived by the user over the placement surface through the sensor layer and the protective layer.

12. The arrangement according to claim 1, wherein the at least one display of the mobile image capture device serves to display information for user guidance and is located adjacent to the placement surface so that user information can be displayed and seen by the user when the placement surface is occupied by the autopodia or the document.

13. The arrangement according to claim 1, wherein the image capture device further comprises a camera for capturing a photograph of a face of the user.

14. The arrangement according to claim 1, wherein the at least one display of the image capture device has a touch function for controlling the mobile image capture device.

15. The arrangement according to claim 1, wherein the image capture device and the further electronic device are provided for data compression and data encoding.

16. A method for optical recording of live skin areas of human autopodia and of documents by using the arrangement according to claim 1, the method comprising:

prompting to place at least one multi-joined autopodium or a document on the placement surface of the layer body by displaying on the display of the image capture device;

placing the at least one multi-joint autopodium or the document on the placement surface of the image capture device;

controlling the light emitting layer in an illumination mode which is suitable either for capturing skin recordings of the autopodium by frustrated total internal reflection or for capturing the documents;

capturing images of skin prints of the autopodium or of the placed document with the sensor layer of the layer body;

storing image data of a captured image in the image capture device;

preprocessing the image data of the captured image and reducing the image data in the image capture device;

sending reduced image data of the captured image from the image capture device to a wirelessly coupled further electronic device;

further processing the image data for quality checking in the coupled further electronic device;

forwarding results of the quality checking from the coupled further electronic device with a prompt to the image capture device for a further image recording or for forwarding complete-image data of a previous image captured by the image capture device; and storing or forwarding transmitted complete-image data.

17. The method according to claim 16, further comprising:

evaluating successive images recorded with the image capture device by means of evaluation software in the coupled further electronic device;

sending a signal from the further electronic device to the image capture device as a trigger for sending complete-image data of an image captured last when the evaluation software of the further electronic device has assessed a quality of the last captured image as good; and sending the complete-image data of the last captured image of skin prints of the autopodia placed on the placement surface or of the document placed on the placement surface from the image capture device to the coupled further electronic device.

18. The method according to claim 16, further comprising:

evaluating successive images of a defined image sequence, the successive images being captured with the image capture device by means of evaluation software in the coupled further electronic device;

sending a signal from the further electronic device to the image capture device as a trigger for sending complete-image data of a selected image of a previously captured image sequence when the evaluation software of the further electronic device has selected an image of the previously captured image sequence as the best-quality image of the image sequence from a plurality of images assessed as good; and sending the complete-image data of the best-quality image of the previously recorded image sequence of skin prints of the placed autopodia or of the placed document from the image capture device to the coupled further electronic device.

19. The method according to claim 16, further comprising:

evaluating successive images of a defined image sequence, the successive images being captured with the image capture device by means of evaluation software in the coupled further electronic device;

sending a signal from the further electronic device to the image capture device as a trigger for sending complete-image data of a selected image of a previously captured image sequence when the evaluation software of the further electronic device has selected an image of the previously captured image sequence as the best-quality image of the image sequence from all of the images classified as being of insufficient quality; and sending the complete-image data of the best-quality image of the previously recorded image sequence of skin prints of the placed autopodia or of the placed document from the image capture device to the coupled further electronic device.

20. The method according to claim 16, further comprising:

sending at least one image captured by the image capture device via the coupled further electronic device to a connected database for checking a personal identity or document validity; and receiving the result of the check on the coupled further electronic device and forwarding to the image capture device when the check has furnished a positive result.

21. The method according to claim 16, further comprising:

sending the at least one image captured by the image capture device via the coupled further electronic device to a connected database for checking a personal identity or document validity; and receiving the result of the check on the coupled further electronic device and triggering a "silent alarm" on the coupled further electronic device when the check has furnished a negative result.

22. The method according to claim 21, wherein the results are shown on the coupled further electronic device acoustically or by vibration.

* * * * *